(12) United States Patent
Kwon et al.

(10) Patent No.: US 10,969,420 B2
(45) Date of Patent: Apr. 6, 2021

(54) TEST CIRCUITS FOR MONITORING NBTI OR PBTI

(71) Applicant: Samsung Electronics Co., Ltd., Suwon-si (KR)

(72) Inventors: Hye Jung Kwon, Seoul (KR); Seungjun Bae, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 326 days.

(21) Appl. No.: 16/023,736

(22) Filed: Jun. 29, 2018

(65) Prior Publication Data
US 2019/0137563 A1 May 9, 2019

(30) Foreign Application Priority Data
Nov. 3, 2017 (KR) .................. 10-2017-0146117

(51) Int. Cl.
| | |
|---|---|
| *G01R 31/02* | (2006.01) |
| *G01R 31/26* | (2020.01) |
| *H03K 3/03* | (2006.01) |
| *G01R 31/317* | (2006.01) |
| *G01R 31/28* | (2006.01) |
| *H01L 21/66* | (2006.01) |

(52) U.S. Cl.
CPC ......... *G01R 31/2642* (2013.01); *G01R 31/26* (2013.01); *G01R 31/2601* (2013.01); *G01R 31/2621* (2013.01); *G01R 31/2856* (2013.01); *G01R 31/2882* (2013.01); *G01R 31/31725* (2013.01); *G01R 31/31727* (2013.01); *H03K 3/0315* (2013.01); *H01L 22/34* (2013.01); *H01L 2924/00* (2013.01); *H01L 2924/0002* (2013.01); *H01L 2924/00012* (2013.01)

(58) Field of Classification Search
CPC ......... H01L 2924/0002; H01L 2924/00; H01L 2924/00014; H01L 22/34; G01R 31/2601; G01R 31/26; G01R 31/2642; G01R 31/2621
USPC ......... 324/71, 378, 403, 415, 425, 500, 537, 324/762.01
See application file for complete search history.

(56) References Cited

U.S. PATENT DOCUMENTS

| | | |
|---|---|---|
| 6,628,134 B1 | 9/2003 | Lee |
| 7,205,854 B2 | 4/2007 | Liu |
| 7,949,482 B2 | 5/2011 | Gebara et al. |

(Continued)

FOREIGN PATENT DOCUMENTS

| | | |
|---|---|---|
| JP | H05-157799 A | 6/1993 |
| JP | 2012-202722 A | 10/2012 |

(Continued)

*Primary Examiner* — Raul J Rios Russo
(74) *Attorney, Agent, or Firm* — Harness, Dickey & Pierce, P.L.C.

(57) ABSTRACT

A test circuit includes a first logic gate that receives a test signal or a first voltage, a second logic gate that receives the test signal, a third logic gate that receives an output of the first logic gate, an output of the second logic gate, or a second voltage, a fourth logic gate that receives the output of the first logic gate or the output of the second logic gate, and a power circuit that prevents the second and fourth logic gates from being driven by supplying power to the second and fourth logic gates when the first logic gate receives the first voltage and the third logic gate receives the second voltage.

20 Claims, 15 Drawing Sheets

(56) References Cited

U.S. PATENT DOCUMENTS

| | | | |
|---|---|---|---|
| 8,456,247 B2 | 6/2013 | Kim et al. | |
| 8,519,730 B2 | 8/2013 | Miyazaki | |
| 2003/0042932 A1* | 3/2003 | Bales | H03K 19/018521 326/63 |
| 2004/0090243 A1* | 5/2004 | Kim | H03K 19/00384 326/83 |
| 2007/0018706 A1* | 1/2007 | Hirata | H03K 3/356139 327/218 |
| 2009/0134908 A1* | 5/2009 | Lim | H03K 19/1736 326/37 |
| 2011/0090015 A1 | 4/2011 | Sumita et al. | |
| 2013/0033947 A1* | 2/2013 | Passerini | G11C 29/12015 365/194 |
| 2013/0223152 A1* | 8/2013 | Passerini | G11C 29/023 365/185.18 |
| 2015/0061726 A1 | 3/2015 | Kawa et al. | |
| 2016/0216315 A1 | 7/2016 | Jung | |
| 2017/0059644 A1 | 3/2017 | Linder et al. | |
| 2017/0141762 A1 | 5/2017 | Uemura et al. | |
| 2017/0317676 A1* | 11/2017 | Kim | H03K 19/00315 |
| 2018/0088176 A1* | 3/2018 | Uemura | G01R 31/31704 |

FOREIGN PATENT DOCUMENTS

| | | |
|---|---|---|
| KR | 2009-0077262 A | 7/2009 |
| KR | 2014-0111711 A | 9/2014 |
| KR | 2015-0024798 A | 3/2015 |

* cited by examiner

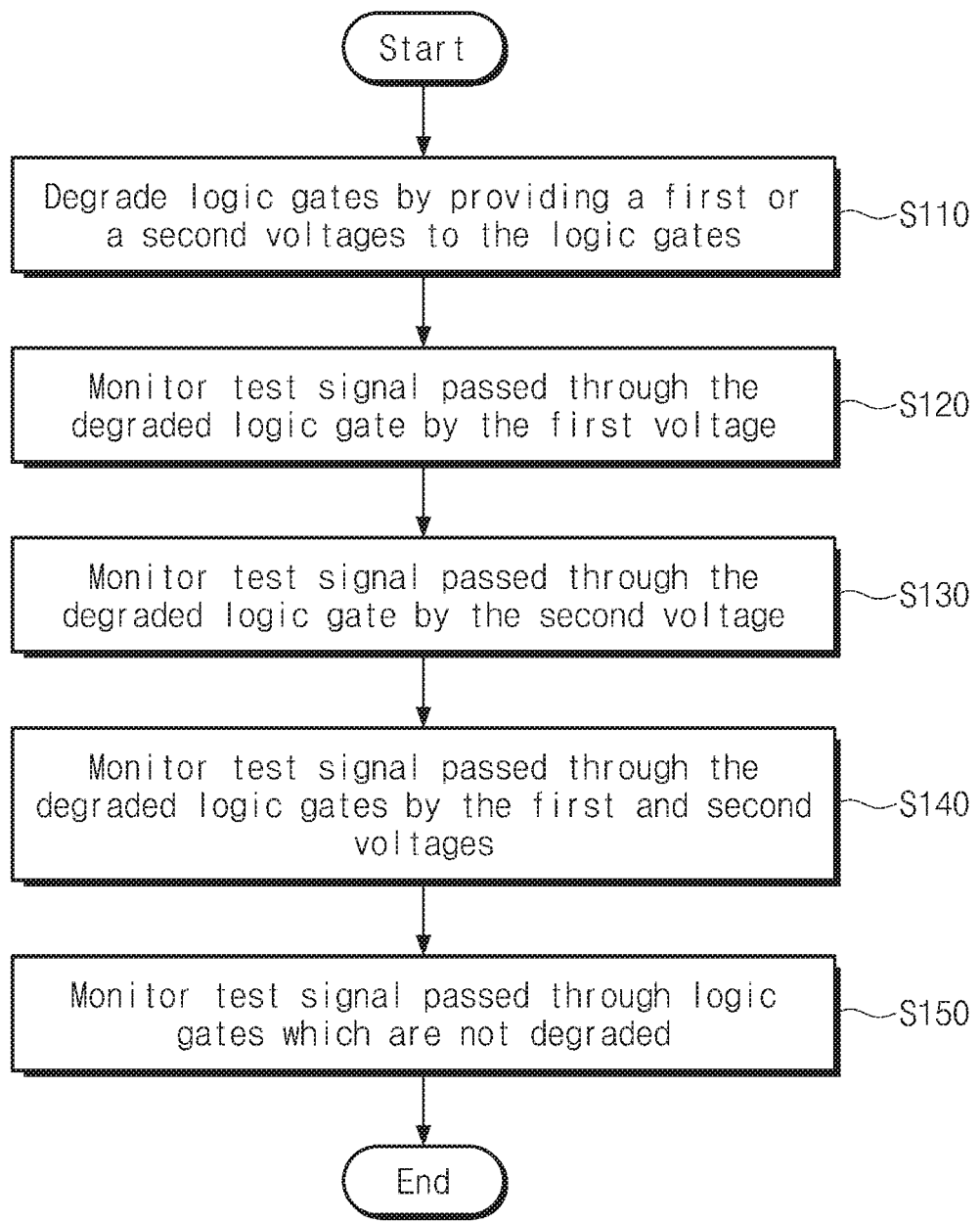

TEST CIRCUITS FOR MONITORING NBTI OR PBTI

CROSS-REFERENCE TO RELATED APPLICATIONS

This U.S. non-provisional patent application claims priority under 35 U.S.C. § 119 to Korean Patent Application No. 10-2017-0146117 filed Nov. 3, 2017, in the Korean Intellectual Property Office, the disclosure of which is incorporated by reference herein in its entirety.

BACKGROUND

Some example embodiments relate to test circuits, and more particularly, to test circuits that monitor negative bias temperature instability (NBTI) or positive bias temperature instability (PBTI).

A transistor may be stressed by bias or temperature. The reliability of the transistor may decrease due to the stress. The decrease in reliability of the transistor may also decrease the lifespan of an integrated circuit incorporating the transistor, that is, the lifespan of a product, and may cause a failure of the product. Accordingly, there is a desire to evaluate the reliability of the transistor in a test (or manufacturing) process.

Due to NBTI or PBTI, a threshold voltage of the transistor may increase, and thus, a drain current may decrease. In a conventional test method, a propagation delay of an inverter chain or a clock characteristic (e.g., a frequency or a duty ratio) of a ring oscillator has been tested to evaluate the NBTI and the PBTI. However, the conventional test method does not evaluate the NBTI and the PBTI separately and does not evaluate the reliability of the transistor before degradation.

SUMMARY

Some example embodiments provide a test circuit that monitors negative bias temperature instability (NBTI) or positive bias temperature instability (PBTI).

According to some example embodiments, a test circuit may include a first logic gate that receives a test signal or a first voltage, a second logic gate that receives the test signal, a third logic gate that receives an output of the first logic gate, an output of the second logic gate, or a second voltage, a fourth logic gate that receives the output of the first logic gate or the output of the second logic gate, and a power circuit that prevents the second and fourth logic gates from being driven by supplying power to the second and fourth logic gates when the first logic gate receives the first voltage and the third logic gate receives the second voltage.

According to some example embodiments, a test circuit may include a first logic gate and a second logic gate that are connected in parallel between a first node and a second node, a third logic gate and a fourth logic gate that are connected in parallel between the second node and a third node, and a switch circuit that selects one of the first and second logic gates and one of the third and fourth logic gates.

According to some example embodiments, a test circuit may include a first logic gate that receives a test signal or a first voltage through a first input switch circuit and outputs a first delay signal through a first output switch, a second logic gate that receives the test signal through a second input switch circuit and outputs a second delay signal through a second output switch, a third logic gate that receives the first delay signal, the second delay signal or a second voltage through a third input switch circuit and outputs a third delay signal through a third output switch, a fourth logic gate that receives the first delay signal or the second delay signal through a fourth input switch circuit and outputs a fourth delay signal through a fourth output switch, and a power circuit that prevents the second and fourth logic gates from being driven by supplying power to the second and fourth logic gates when the first logic gate receives the first voltage and the third logic gate receives the second voltage. The first to fourth input switch circuits may be the same as each other, the first to fourth output switches may be the same as each other, and the first to fourth logic gates may be the same as each other.

BRIEF DESCRIPTION OF THE FIGURES

The above and other objects and features of some example embodiments will become apparent by describing with reference to the accompanying drawings.

FIG. 15 is a flowchart illustrating a test method of the test system of FIG. 14.

DETAILED DESCRIPTION

Below, some example embodiments may be described in detail and clearly to such an extent that one of ordinary skill in the art may easily implements the example embodiments.

Figure 1:
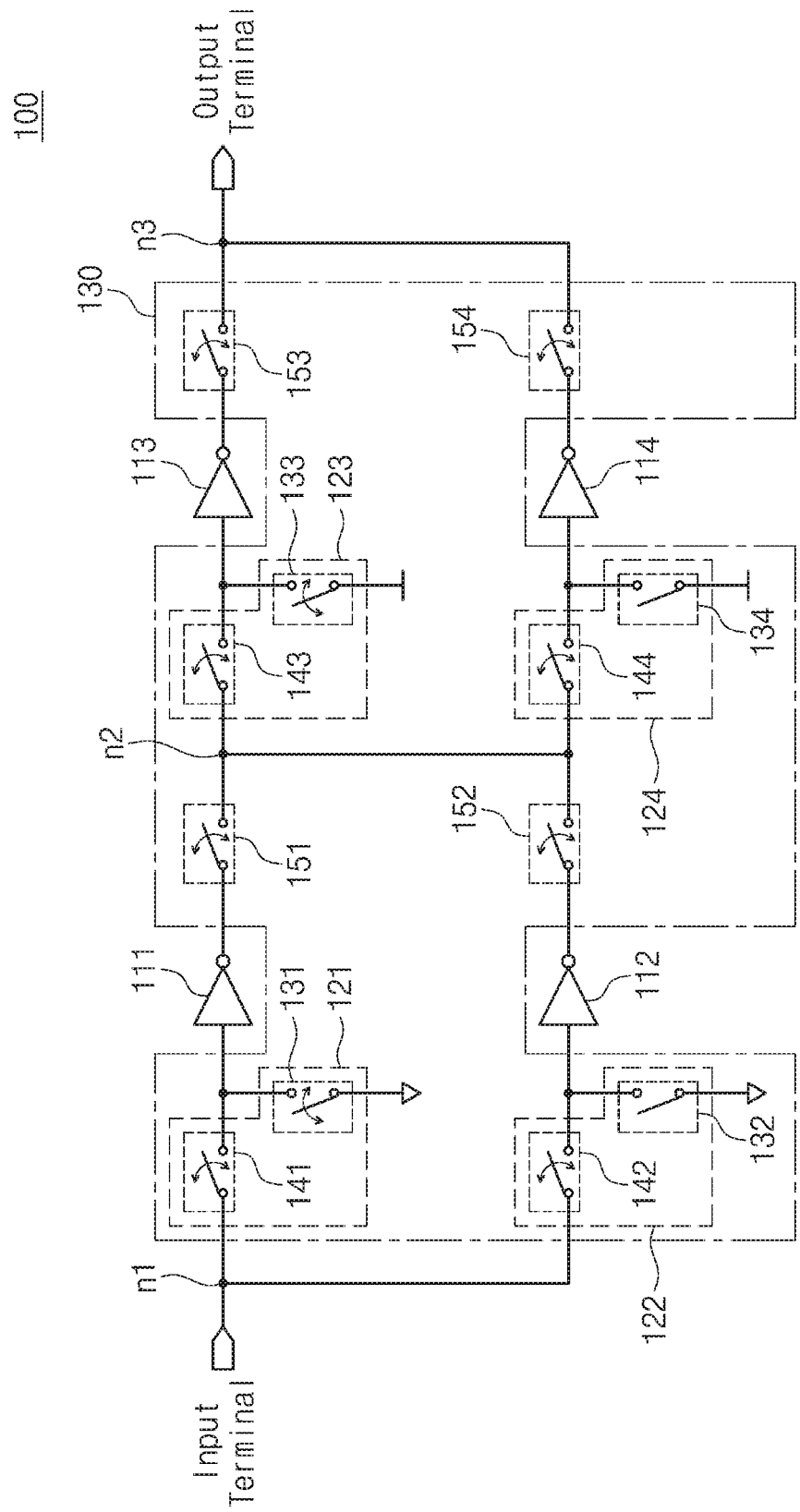
FIG. 1 is a block diagram illustrating a test circuit according to some example embodiments.

FIG. 1 is a block diagram illustrating a test circuit according to some example embodiments. A test circuit 100 may measure the reliability of a transistor. Due to negative bias temperature instability (NBTI) or positive bias temperature instability (PBTI), a threshold voltage of the transistor may increase, and thus, a drain current may decrease. The test circuit 100 may measure the degree of degradation of a transistor due to the NBTI or PBTI by using a logic gate that is composed of transistors.

Referring to FIG. 1, the test circuit 100 may include first to fourth inverters 111 to 114 and a switch circuit 130. The first to fourth inverters 111 to 114 may be logic gates for measuring a degradation characteristic of a semiconductor element. An inverter is illustrated in FIG. 1 as an example of a logic gate. However, some example embodiments may not be limited thereto.

The first to fourth inverters 111 to 114 may be arranged between an input terminal and an output terminal. In detail, the first and second inverters 111 and 112 may be connected in parallel between a first node n1 and a second node n2. The third and fourth inverters 113 and 114 may be connected in parallel between the second node n2 and a third node n3. The switch circuit 130 may select the first to fourth inverters 111 to 114. Inverters selected by the switch circuit 130 may be electrically connected between the input terminal and the output terminal, and unselected inverters may not be electrically connected between the input terminal and the output terminal. In detail, the switch circuit 130 may select one of the first and second inverters 111 and 112 and may select one of the third and fourth inverters 113 and 114.

Here, the input terminal may refer to a pad, a terminal, a port, or a node used for the test circuit 100 to receive a test signal from the outside and may be connected to the first node n1. As in the above description, the output terminal may refer to a pad, a terminal, a port, or a node used for the test circuit 100 to output the test signal to the outside and may be connected to the third node n3.

The switch circuit 130 may include a first input switch circuit 121 and a first output switch 151 that are connected with the first inverter 111, a second input switch circuit 122 and a second output switch 152 that are connected with the second inverter 112, a third input switch circuit 123 and a third output switch 153 that are connected with the third inverter 113, and a fourth input switch circuit 124 and a fourth output switch 154 that are connected with the fourth inverter 114.

The first input switch circuit 121 may include a first power switch 131 and a first input switch 141. The second input switch circuit 122 may include a second power switch 132 and a second input switch 142. The third input switch circuit 123 may include a third power switch 133 and a third input switch 143. The fourth input switch circuit 124 may include a fourth power switch 134 and a fourth input switch 144.

The first inverter 111 may receive a first voltage corresponding to logic "0" through the first power switch 131 or may receive a signal applied to the input terminal through the first input switch 141. The first inverter 111 may invert the input signal and may output a first delay signal through the first output switch 151.

The second inverter 112 may receive the signal applied to the input terminal through the second input switch 142. The second inverter 112 may invert the input signal and may output a second delay signal through the second output switch 152. The second power switch 132, the second input switch 142, the second output switch 152, and the second inverter 112 may be a replica circuit of the first power switch 131, the first input switch 141, the first output switch 151, and the first inverter 111.

The third inverter 113 may receive a second voltage corresponding to logic "1" through the third power switch 133 or may receive one of the first and second delay signals through the third input switch 143. The third inverter 113 may invert the input signal and may output a third delay signal through the third output switch 153.

The fourth inverter 114 may receive one of the first and second delay signals through the fourth input switch 144.

The fourth inverter 114 may invert the input signal and may output a fourth delay signal through the fourth output switch 154. The fourth power switch 134, the fourth input switch 144, the fourth output switch 154, and the fourth inverter 114 may be a replica circuit of the third power switch 133, the third input switch 143, the third output switch 153, and the third inverter 113.

Although not illustrated in FIG. 1, the first and second voltages may be supplied to the first to fourth inverters 111 to 114 as power. For example, the first voltage may be VSS (source supply voltage), and the second voltage may be VDD (drain supply voltage). Below, according to some example embodiments, a method of degrading some of the transistors of the test circuit 100 will be described.

Figure 2:
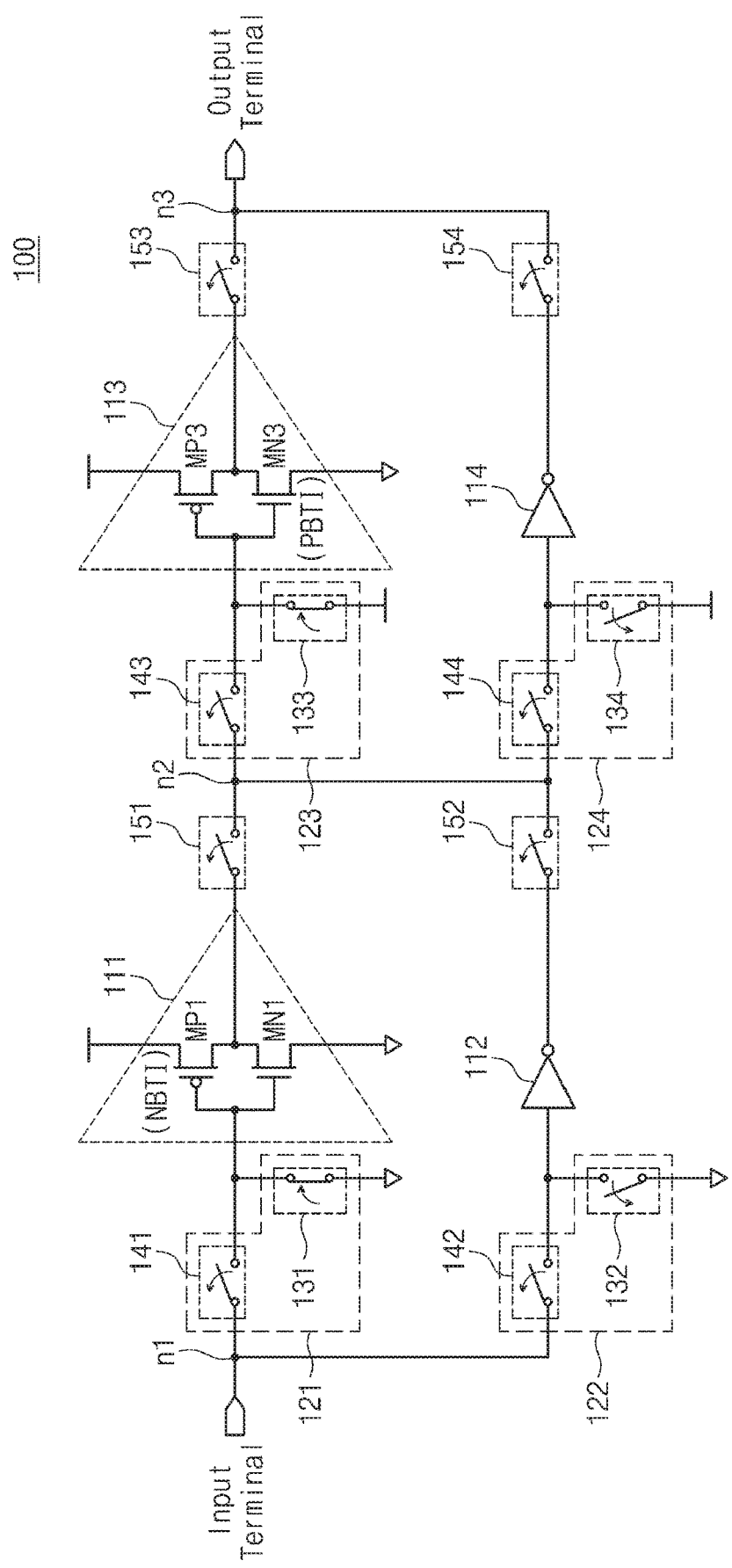
FIG. 2 is a view illustrating an operation of a switch circuit for degrading some of transistors of the test circuit of FIG. 1.

FIG. 2 is a view illustrating an operation of a switch circuit for degrading some of the transistors of a test circuit of FIG. 1. For brevity of illustration, a dotted line indicating the switch circuit 130 is omitted in FIG. 2.

Referring to FIG. 2, the first inverter 111 is illustrated in detail. The first inverter 111 may include a first P-type Metal-Oxide Semiconductor (PMOS) transistor MP1 and a first N-type Metal-Oxide Semiconductor (NMOS) transistor MN1. A gate of the first PMOS transistor MP1 and a gate of the first NMOS transistor MN1 may be electrically connected to each other to form an input terminal of the first inverter 111. A drain of the first PMOS transistor MP1 and a drain of the first NMOS transistor MN1 may be electrically connected to each other to form an output terminal of the first inverter 111. The first voltage may be supplied as power to a source of the first NMOS transistor MN1, and the second voltage may be supplied as power to a source of the first PMOS transistor MP1. The third inverter 113 may include a third PMOS transistor MP3 and a third NMOS transistor MN3 and may be similar to or the same as the first inverter 111.

A switch circuit that includes the first power switch 131 and the third power switch 133 may be configured to provide the first voltage to the first inverter 111 and to provide the second voltage to the third inverter 113. In detail, the first power switch 131 may be turned on to degrade the first PMOS transistor MP1. The first voltage may be applied to the gate of the first PMOS transistor MP1 by the first power switch 131. As described above, the first voltage may be VSS corresponding to logic "0". Alternatively, the first voltage may be in advance set to VSS or a lower level than VSS for degrading the first PMOS transistor MP1.

The third power switch 133 may be turned on to degrade the third NMOS transistor MN3. The second voltage may be applied to the gate of the third NMOS transistor MN3 by the third power switch 133. As described above, the second voltage may be VDD corresponding to logic "1". Alternatively, the second voltage may be in advance set to VDD or a higher level than VDD for degrading the third NMOS transistor MN3.

In some example embodiments, to degrade the first PMOS transistor MP1 and the third NMOS transistor MN3, a time when the first and second voltages are respectively applied to the first PMOS transistor MP1 and the third NMOS transistor MN3 and a temperature during the applying time may be determined in advance. Also, the time to apply the first and second voltages and the temperature may be determined in advance in consideration of the lifespan of a product. For example, in a wafer burn in test process, heat may be applied to the first PMOS transistor MP1 and the third NMOS transistor MN3 depending on a set condition during a given time. If the first voltage and the second voltage are respectively applied to the gate of the first PMOS transistor MP1 and the gate of the third NMOS transistor MN3 depending on the set condition, the first PMOS transistor MP1 may be degraded (e.g., NBTI), and the third NMOS transistor MN3 may be degraded (e.g., PBTI).

To reduce or prevent degradation of the remaining transistors of the test circuit 100 except for the first PMOS transistor MP1 and the third NMOS transistor MN3, only the first and third power switches 131 and 133 may be turned on, and the remaining switches 132, 134, 141 to 144, and 151 to 154 may be turned off. In this case, transistors included the remaining switches 132, 134, 141 to 144, and 151 to 154 may not be degraded. In detail, a switch may include an NMOS transistor, a PMOS transistor, or NMOS and PMOS transistors. Under a turn-off condition, the first voltage may be applied to an NMOS transistor, and the second voltage may be applied to a PMOS transistor. Accordingly, if the switch is turned off, the transistor(s) of the switch may not be degraded.

Also, if only the first and third power switches 131 and 133 are turned on and the remaining switches 132, 134, 141 to 144, and 151 to 154 are turned off, gates of transistors (not illustrated) of the second and fourth inverters 112 and 114 may be floated. Accordingly, the transistors (not illustrated) of the second and fourth inverters 112 and 114 may not be degraded.

The second and fourth inverters 112 and 114 may not be degraded when the first and third inverters 111 and 113 are degraded. To evaluate only the degree of degradation of the first inverter 111, the second inverter 112 may be similar to or the same as the first inverter 111. Also, the second input switch circuit 122 may be similar to or the same as the first input switch circuit 121, and the second output switch 152 may be similar to or the same as the first output switch 151. Accordingly, the NBTI of the first inverter 111 may be accurately evaluated by comparing the case where a test signal applied to the input terminal passes through the first inverter 111 with the case where the test signal passes through the second inverter 112.

As in the above description, to evaluate only the degree of degradation of the third inverter 113, the fourth inverter 114 may be similar to or the same as the third inverter 113. Also, the fourth input switch circuit 124 may be similar to or the same as the third input switch circuit 123, and the fourth output switch 154 may be similar to or the same as the third output switch 153. Accordingly, the PBTI of the third inverter 113 may be accurately evaluated by comparing the case where a test signal applied to the input terminal passes through the third inverter 113 with the case where the test signal passes through the fourth inverter 114.

Figure 3:
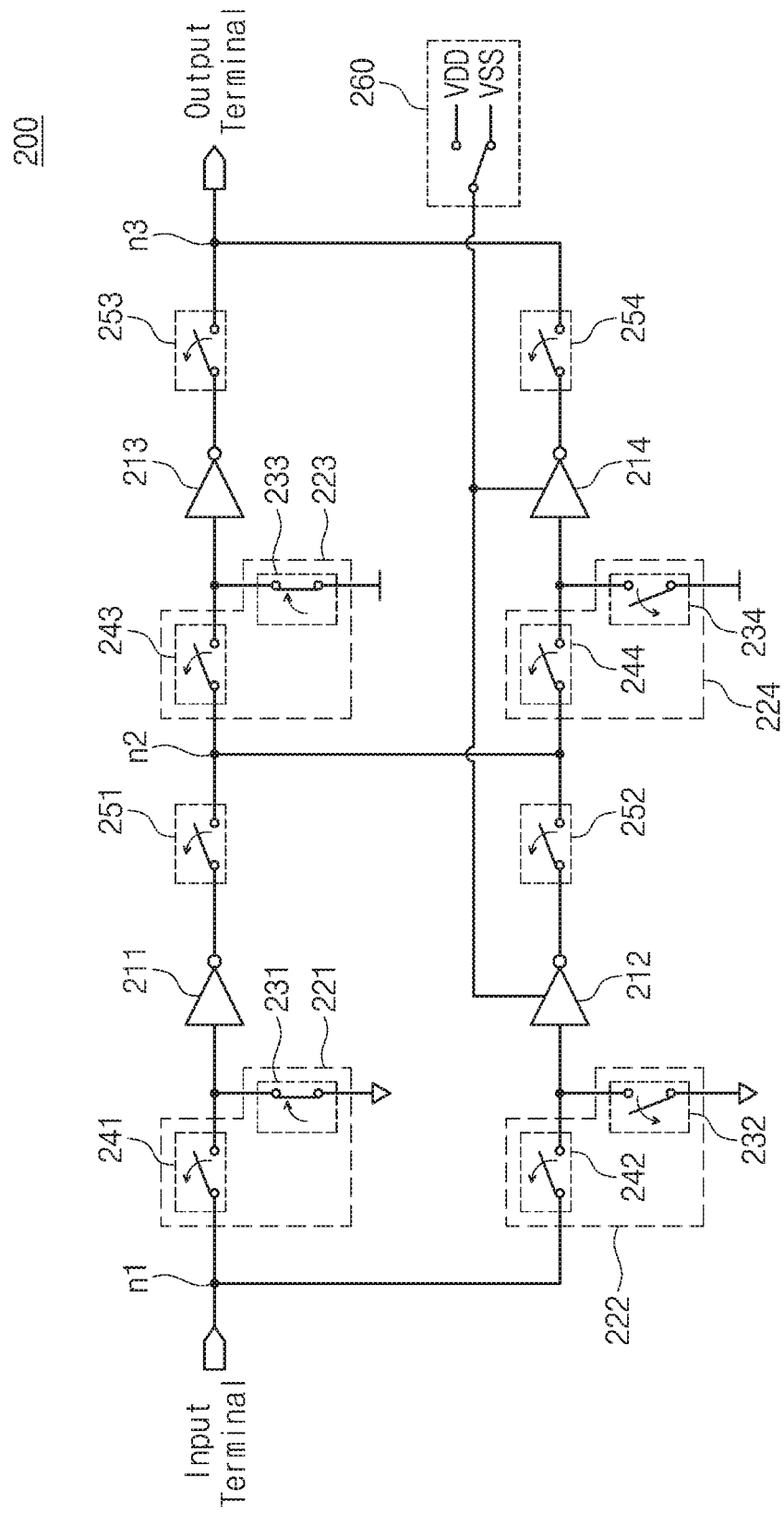
FIG. 3 is a block diagram illustrating the test circuit including a power circuit according to some example embodiments.

FIG. 3 is a block diagram illustrating a test circuit including a power circuit according to some example embodiments. Referring to FIG. 3, a test circuit 200 may include first to fourth inverters 211 to 214, first to fourth input switch circuits 221 to 224, first to fourth output switches 251 to 254, and a power circuit 260. The first input switch circuit 221 may include a first power switch 231 and a first input switch 241, the second input switch circuit 222 may include a second power switch 232 and a second input switch 242, the third input switch circuit 223 may include a third power switch 233 and a third input switch 243, and the fourth input switch circuit 224 may include a fourth power switch 234 and a fourth input switch 244.

Here, the first to fourth inverters 211 to 214, the first to fourth input switch circuits 221 to 224, and the first to fourth output switches 251 to 254 may be implemented and operate to be similar to or the same as those of FIGS. 1 and 2.

The test circuit 200 of FIG. 3 may further include the power circuit 260 for reducing or preventing the degradation of transistors (not illustrated) of the second and fourth inverters 212 and 214 compared with the test circuit 100 of FIGS. 1 and 2. As in FIG. 2, only the first and third power switches 231 and 233 may be turned on, and the remaining switches 232, 234, 241 to 244, and 251 to 254 may be turned off. That is, when the first inverter 211 receives the first voltage and the third inverter 213 receives the second voltage, the power circuit 260 may supply power to each of the second and fourth inverters 212 and 214 such that the second and fourth inverters 212 and 214 are not driven (or operated). Driving logic gates, as discussed in the present disclosure, refers to, for example, applying one or more voltages to the transistors included in the logic gates that exceed the threshold voltage of the transistors such that the transistors are intentionally turned on.

If the second and fourth power circuits 232 and 234 and the second and fourth input switches 242 and 244 are turned off, gates of transistors (not illustrated) of the second and fourth inverters 212 and 214 may be floated, and the second and fourth inverters 212 and 214 may not be driven by the power circuit 260. Accordingly, transistors (not illustrated) of the second and fourth inverters 212 and 214 may not be degraded while a PMOS transistor of the first inverter 211 and an NMOS transistor of the third inverter 213 are degraded.

In detail, the power circuit 260 may be configured to supply VSS as power to each of the second and fourth inverters 212 and 214 during a degradation mode where the first and third power switches 231 and 233 are turned on. The power circuit 260 may be configured to supply VDD as power to each of the second and fourth inverters 212 and 214 during any other mode(s) except for the degradation mode. For example, the power circuit 260 may include a PMOS transistor to supply VDD, an NMOS transistor to supply VSS, and a control circuit to determine whether to operate the above-described transistors. Below, a method of evaluating the NBTI of a PMOS transistor of the first inverter 211 and the PBTI of an NMOS transistor of the third inverter 213 will be described.

FIGS. 4 to 7 are block diagrams illustrating operations of a test circuit according to some example embodiments. For brevity of illustration, dotted lines indicating first to fourth input switch circuits are omitted in FIGS. 4 to 7. Referring to FIGS. 4 to 7, a test circuit 300 may include first to fourth inverters 311 to 314, first to fourth power switches 331 to 334, first to fourth input switches 341 to 344, and first to fourth output switches 351 to 354. The test circuit 300 may correspond to the test circuit 100 or 200 of FIG. 2 or 3 after the first power switch 131 or 231 and the third power switch 133 or 233 are turned on and thus PMOS and NMOS transistors are degraded.

Due to the NBTI, a propagation delay of the first inverter 311 may be greater than a propagation delay of the second inverter 312. Also, due to the PBTI, a propagation delay of the third inverter 313 may be greater than a propagation delay of the fourth inverter 314. Accordingly, the NBTI and the PBTI may be accurately tested by comparing the propagation delays of the first to fourth inverters 311 to 314.

Referring to FIGS. 4 to 7, a test signal may be applied to the input terminal. The test signal may be a signal for evaluating the NBTI and/or the PBTI, for example, the test signal may be a clock signal. In FIGS. 4 to 7, all of the first to fourth power switches 331 to 334 may be turned off.

Figure 4:
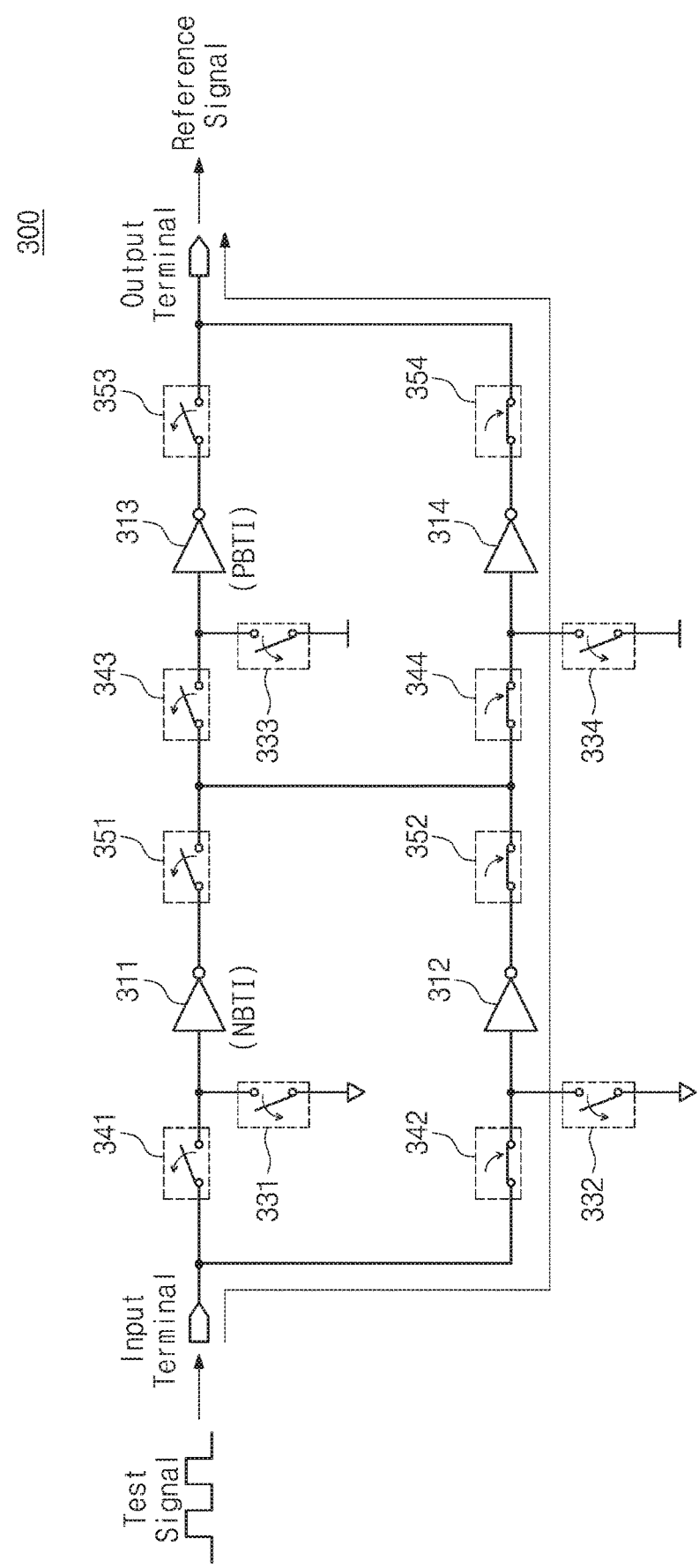
FIGS. 4 to 7 are block diagrams illustrating operations of the test circuit according to some example embodiments.
Figure 5:
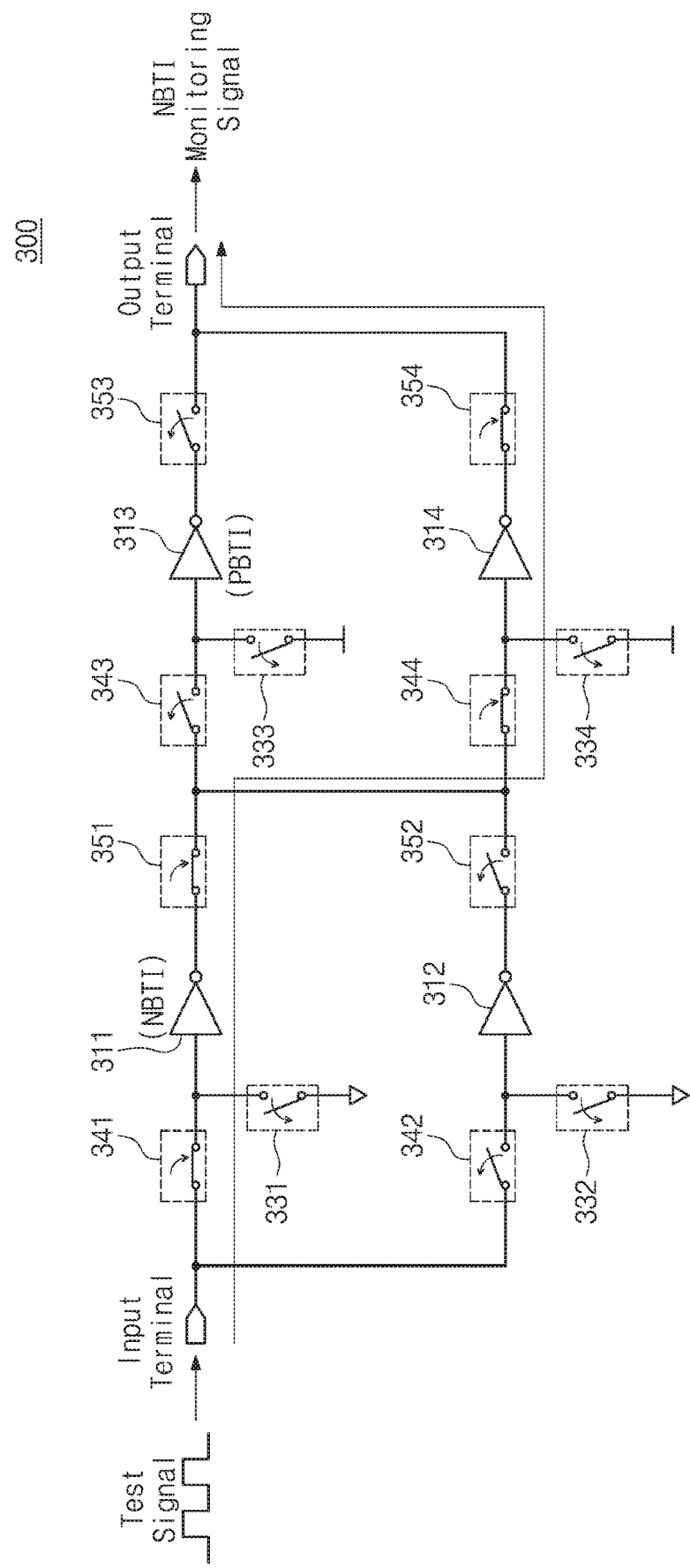

FIG. 4 may relate to the test circuit 300 for outputting a reference signal. Here, the reference signal may indicate a signal that is not delayed due to the NBTI or the PBTI. FIG. 5 may relate to the test circuit 300 for outputting an NBTI monitoring signal, FIG. 6 may relate to the test circuit 300 for outputting a PBTI monitoring signal, and FIG. 7 may relate to the test circuit 300 for outputting an NBTI and PBTI monitoring signal.

Referring to FIG. 4, to output the reference signal, the second input switch 342, the second output switch 352, the fourth input switch 344, and the fourth output switch 354 may be turned on, and the remaining switches may be turned off. The test signal may sequentially pass through the second and fourth inverters 312 and 314.

The reference signal may be the test signal delayed as much as a sum of propagation delays of the second input switch 342, the second inverter 312, the second output switch 352, the fourth input switch 344, the fourth inverter 314, and the fourth output switch 354. Accordingly, the reference signal may be a signal that is not delayed due to the NBTI of a PMOS transistor of the first inverter 311 or the PBTI of an NMOS transistor of the third inverter 313.

Referring to FIG. 5, to output the NBTI monitoring signal, the first input switch 341, the first output switch 351, the fourth input switch 344, and the fourth output switch 354 may be turned on, and the remaining switches may be turned off. The test signal may sequentially pass through the first and fourth inverters 311 and 314.

The NBTI monitoring signal may be the test signal delayed as much as a sum of propagation delays of the first input switch 341, the first inverter 311, the first output switch 351, the fourth input switch 344, the fourth inverter 314, and the fourth output switch 354. Accordingly, the NBTI monitoring signal may be delayed more than the reference signal due to the NBTI of the PMOS transistor of the first inverter 311. Here, the NBTI monitoring signal may not be delayed due to the PBTI of the NMOS transistor of the third inverter 313 because the NBTI monitoring signal does not pass through the third inverter 313.

Figure 6:
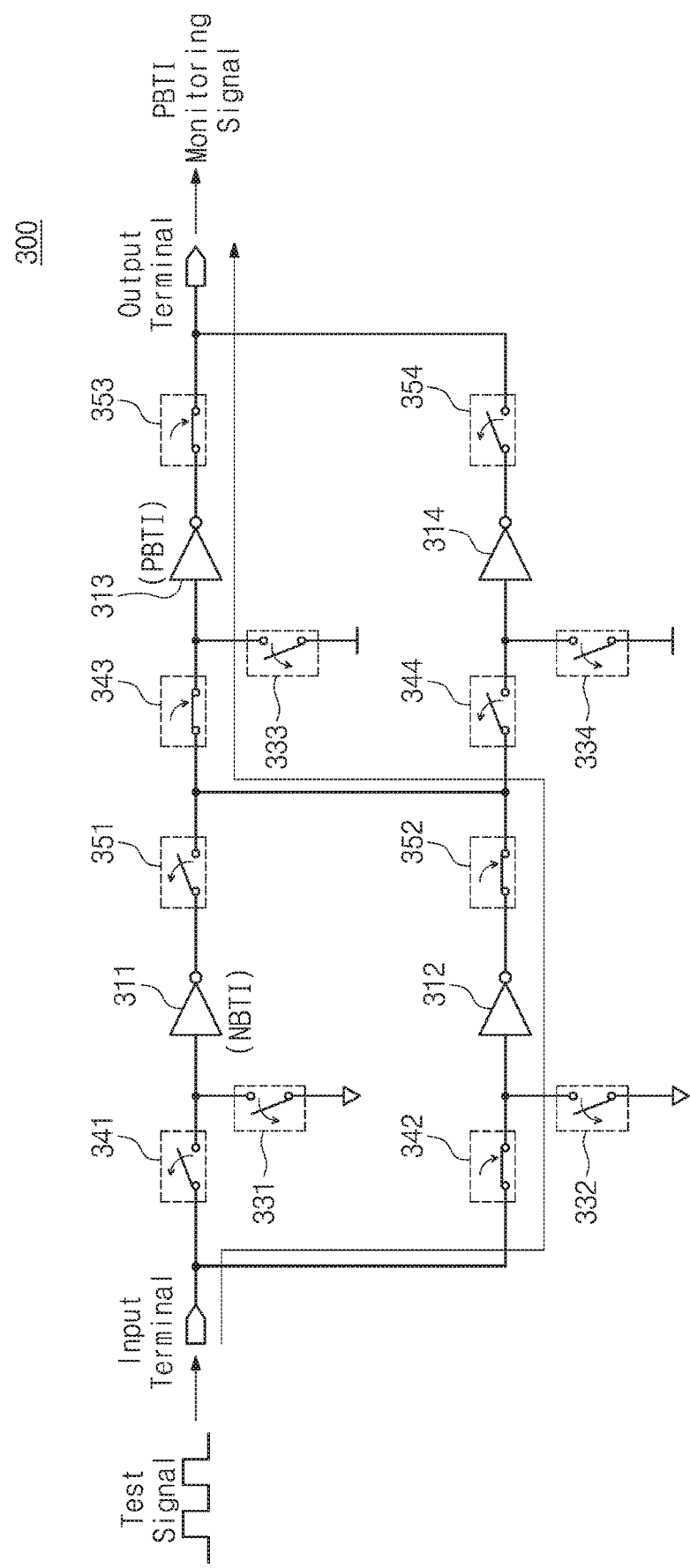

Referring to FIG. 6, to output the PBTI monitoring signal, the second input switch 342, the second output switch 352, the third input switch 343, and the third output switch 353 may be turned on, and the remaining switches may be turned off. The test signal may sequentially pass through the second and third inverters 312 and 313.

The PBTI monitoring signal may be the test signal delayed as much as a sum of propagation delays of the second input switch 342, the second inverter 312, the second output switch 352, the third input switch 343, the third inverter 313, and the third output switch 353. Accordingly, the PBTI monitoring signal may be delayed more than the reference signal due to the PBTI of the NMOS transistor of the third inverter 313. Here, the PBTI monitoring signal may not be delayed due to the NBTI of the PMOS transistor of the first inverter 311 because the PBTI monitoring signal does not pass through the first inverter 311.

Figure 7:
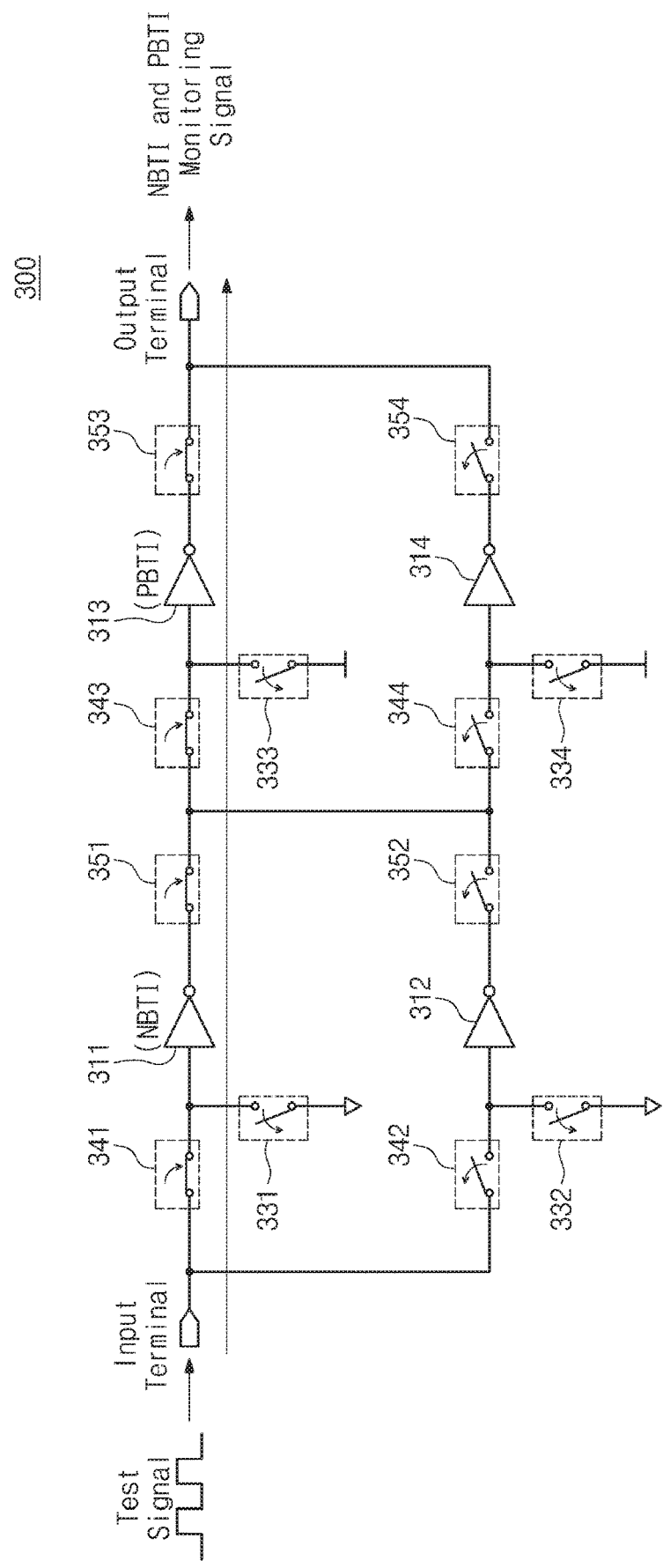

Referring to FIG. 7, to output the NBTI and PBTI monitoring signal, the first input switch 341, the first output switch 351, the third input switch 343, and the third output switch 353 may be turned on, and the remaining switches may be turned off. The test signal may sequentially pass through the first and third inverters 311 and 313.

The NBTI and PBTI monitoring signal may be the test signal delayed as much as a sum of propagation delays of the first input switch 341, the first inverter 311, the first output switch 351, the third input switch 343, the third inverter 313, and the third output switch 353. Accordingly, the NBTI and PBTI monitoring signal may be delayed more than the reference signal due to the NBTI of the PMOS transistor of the first inverter 311 and the PBTI of the NMOS transistor of the third inverter 313. Also, the NBTI and PBTI monitoring signal may be delayed more than the NBTI monitoring signal and the PBTI monitoring signal.

To sum up, a switch circuit that includes the first to fourth input switches 341 to 344 and the first to fourth output switches 351 to 354 may be configured to electrically connect two of the first to fourth inverters 311 to 314 such that the test signal is output through two of the first to fourth inverters 311 to 314.

Figure 8:
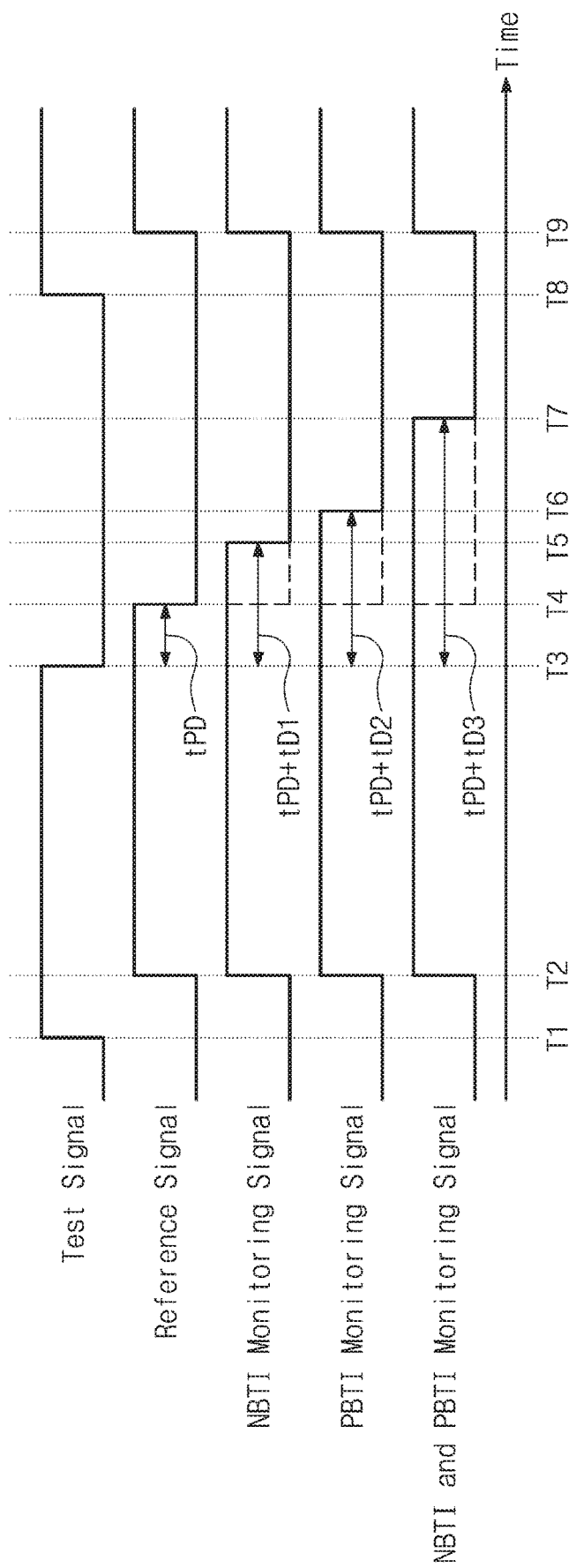
FIG. 8 is a timing diagram illustrating a test signal, a reference signal, an NBTI monitoring signal, a PBTI monitoring signal, and an NBTI and PBTI monitoring signal as illustrated in FIGS. 4 to 7.

FIG. 8 is a timing diagram illustrating a test signal, a reference signal, an NBTI monitoring signal, a PBTI monitoring signal, and an NBTI and PBTI monitoring signal as illustrated in FIGS. 4 to 7.

At T1, a test signal may be changed from logic "0" to logic "1". A rising edge of the test signal may be formed at T1. As described above, the test signal may be applied to an input terminal of the test circuit 300 as a clock signal.

At T2, each of a reference signal, an NBTI monitoring signal, a PBTI monitoring signal, and an NBTI and PBTI monitoring signal may be changed from logic "0" to logic "1". In the case where the test signal is changed from logic "0" to logic "1", a PMOS transistor of the first inverter 311 is turned off, and an NMOS transistor of the third inverter 313 is turned off. Accordingly, rising edges of the reference signal, the NBTI monitoring signal, the PBTI monitoring signal, and the NBTI and PBTI monitoring signal may be formed equally at T2.

According to some example embodiments, rising edges of the reference signal and the monitoring signals may be formed contemporaneously. To this end, the first to fourth inverters 311 to 314 may be similar to or the same as each other, the first to fourth power switches 331 to 334 may be similar to or the same as each other, the first to fourth input switches 341 to 344 may be similar to or the same as each other, and the first to fourth output switches 351 to 354 may be similar to or the same as each other.

In particular, since the first voltage or the second voltage for degradation is not applied to the second and fourth inverters 312 and 314, the test circuit 300 may not include the second and fourth power switches 332 and 334. However, in the case where the test circuit 300 includes the second and fourth power switches 332 and 334, the second power switch 332 may provide a load of the first power switch 331 as a dummy switch to an input terminal of the second inverter 312, and the fourth power switch 334 may provide a load of the third power switch 333 as a dummy switch to an input terminal of the fourth inverter 314.

That is, loads of the input terminals of the first to fourth inverters 311 to 314 may be similar to or the same as each other. As in the above description, loads of output terminals of the first to fourth inverters 311 to 314 may be similar to or the same as each other. Rising edges of the reference signal, the NBTI monitoring signal, the PBTI monitoring signal, and the NBTI and PBTI monitoring signal may be formed contemporaneously at T2.

At T3, the test signal may be changed from logic "1" to logic "0". A falling edge of the test signal may be formed at T3.

At T4, the reference signal may be changed from logic "1" to logic "0". A falling edge of the reference signal may be formed at T4. The reference signal may be the test signal delayed as much as tPD. "tPD" may be a sum of propagation delays of the second input switch 342, the second inverter 312, the second output switch 352, the fourth input switch 344, the fourth inverter 314, and the fourth output switch 354. "tPD" may not include a delay due to the NBTI or PBTI.

At T5, the NBTI monitoring signal may be changed from logic "1" to logic "0". A falling edge of the NBTI monitoring signal may be formed at T5. The NBTI monitoring signal may be the test signal delayed as much as "tPD+tD1". "tPD+tD1" may be a sum of propagation delays of the first input switch 341, the first inverter 311, the first output switch 351, the fourth input switch 344, the fourth inverter 314, and the fourth output switch 354. "tD1" may indicate a delay due to the NBTI of the PMOS transistor of the first inverter 311.

At T6, the PBTI monitoring signal may be changed from logic "1" to logic "0". A falling edge of the PBTI monitoring signal may be formed at T6. The PBTI monitoring signal may be the test signal delayed as much as "tPD+tD2". "tPD+tD2" may be a sum of propagation delays of the second input switch 342, the second inverter 312, the second output switch 352, the third input switch 343, the third inverter 313, and the third output switch 353. "tD2" may indicate a delay due to the PBTI of the NMOS transistor of the third inverter 313. An example is illustrated in FIG. 8 as "tD2" is greater than "tD1". However, "tD2" may be the same as or less than "tD1".

At T7, the NBTI and PBTI monitoring signal may be changed from logic "1" to logic "0". A falling edge of the NBTI and PBTI monitoring signal may be formed at T7. The NBTI and PBTI monitoring signal may be the test signal delayed as much as "tPD+tD3". "tPD+tD3" may be a sum of propagation delays of the first input switch 341, the first inverter 311, the first output switch 351, the third input switch 343, the third inverter 313, and the third output switch 353. "tD3" may indicate a delay due to the NBTI of the PMOS transistor of the first inverter 311 and the PBTI of the NMOS transistor of the third inverter 313.

At T8, the test signal may be changed from logic "0" to logic "1" as the clock signal. At T9, each of the reference signal, the NBTI monitoring signal, the PBTI monitoring signal, and the NBTI and PBTI monitoring signal may be changed from logic "0" to logic "1".

A delay due to the NBTI, a delay due to the PBTI, and a delay due to the NBTI and the PBTI may be tested by evaluating or measuring "tPD", "tPD+tD1", "tPD+tD2", and "tPD+tD3" from the reference signal, the NBTI monitoring signal, the PBTI monitoring signal, and the NBTI and PBTI monitoring signal.

Referring to FIG. 8, duty ratios of the reference signal, the NBTI monitoring signal, the PBTI monitoring signal, and the NBTI and PBTI monitoring signal may be different from each other due to the NBTI and the PBTI. Accordingly, "tD1", "tD2", and "tD3" may be tested by evaluating or measuring the duty ratios of the reference signal, the NBTI monitoring signal, the PBTI monitoring signal, and the NBTI and PBTI monitoring signal.

According to some example embodiments, even after the PMOS transistor of the first inverter 311 and the NMOS transistor of the third inverter 313 are degraded, the reference signal not delayed due to the NBTI and the PBTI, a signal delayed due to the NBTI, a signal delayed due to the PBTI, and a signal delayed due to the NBTI and the PBTI may be tested, respectively.

The rising edges of the reference signal, the NBTI monitoring signal, the PBTI monitoring signal, and the NBTI and PBTI monitoring signal are illustrated in FIG. 8 as being formed contemporaneously or at the same time point. If the first inverter 311 is degraded by the first voltage and the third inverter 313 is degraded by the second voltage, rising edges of the reference signal, the NBTI monitoring signal, the PBTI monitoring signal, and the NBTI and PBTI monitoring signal may be formed at different time points, and falling edges thereof may be formed contemporaneously or at the same time point. That is, the timing diagram of FIG. 8 is only an example.

Figure 9:
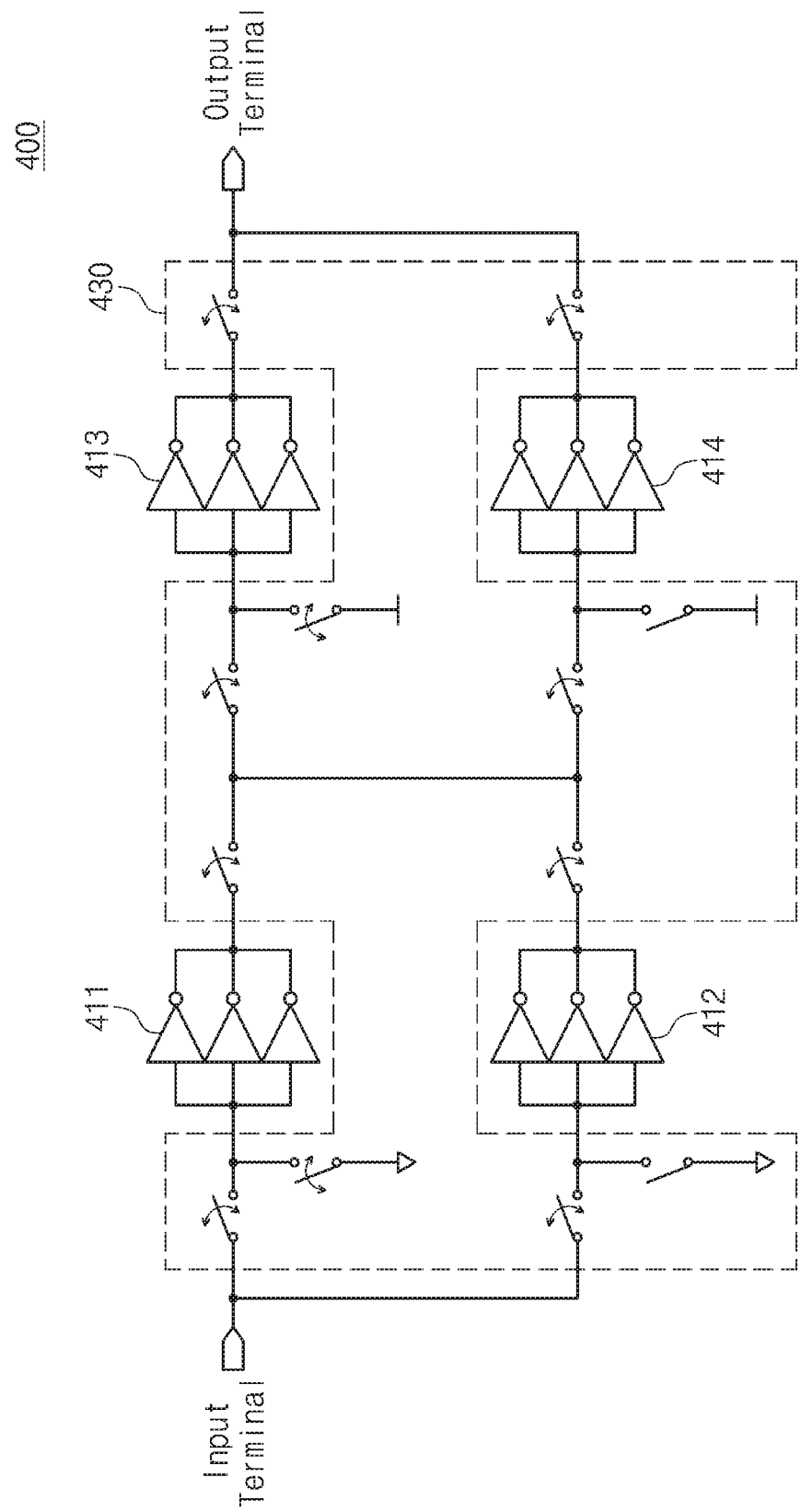
FIG. 9 is a block diagram illustrating a test circuit for degrading and testing a plurality of logic gates in parallel according to some example embodiments.

FIG. 9 is a block diagram illustrating a test circuit for degrading and testing a plurality of logic gates in parallel according to some example embodiments. A test circuit 400 may include first to fourth inverters 411 to 414 and a switch circuit 430. In general, the size, kind, configuration, and fan out of a logic gate used in an integrated circuit may be various. A test circuit according to some example embodiments may degrade and test various logic gates used in an integrated circuit. FIG. 9 may relate to the example where three inverters are connected in parallel.

Compared with an inverter of FIGS. 1 to 7, the first inverter 411 may be composed of at least two or more inverters. An example is illustrated in FIG. 9 as the first inverter 411 is composed of three inverters and the three inverters are connected in parallel. Each of the second to fourth inverters 412 to 414 may be similar to or the same as the first inverter 411.

The switch circuit 430 may be similar to or the same as the above-described switch circuit 130. Three PMOS transistors of the first inverter 411 may be degraded by the first voltage, and three NMOS transistors of the third inverter 413 may be degraded by the second voltage. Below, a method in which a reference signal, an NBTI monitoring signal, a PBTI monitoring signal, and an NBTI and PBTI monitoring signal are output may be similar to the method described with reference to FIGS. 4 to 8.

Figure 10:
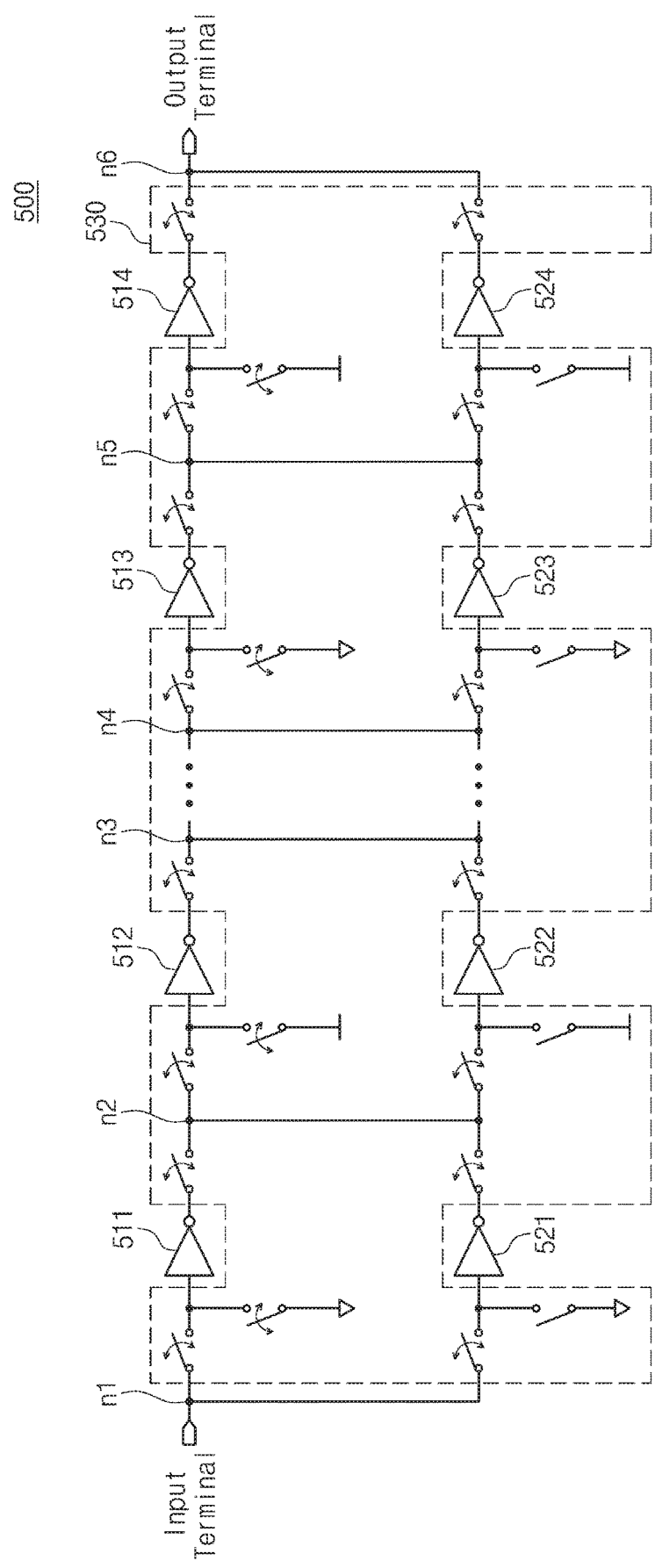
FIG. 10 is a block diagram illustrating a test circuit for degrading and testing more than two logic gates in series according to some example embodiments.

FIG. 10 is a block diagram illustrating a test circuit for degrading and testing more than two logic gates in series according to some example embodiments. Referring to FIG. 10, a test circuit 500 may include a plurality of first inverters 511 to 514, a plurality of second inverters 521 to 524, and a switch circuit 530. An example is illustrated in FIGS. 1 to 7 as two inverters are connected between an input terminal and an output terminal. However, some example embodiments may not be limited thereto. FIG. 10 may refer to the case where at least two or more inverters are arranged between the input terminal and the output terminal.

The plurality of first inverters 511 to 514 and the plurality of second inverters 521 to 524 may be arranged between the input terminal and the output terminal. The number of the plurality of first inverters 511 to 514 may be at least two or more, and the number of the plurality of second inverters 521 to 524 may also be at least two or more. The plurality of first inverters 511 to 514 may operate similarly to or the same as the first and third inverters of FIGS. 1 to 7. The plurality of second inverters 521 to 524 may operate similarly to or the same as the second and fourth inverters of FIGS. 1 to 7.

As in the switch circuit 130 of FIG. 2, the switch circuit 530 may degrade the plurality of first inverters 511 to 514. Each of the plurality of first inverters 511 to 514 may receive the first voltage or the second voltage as an input by the switch circuit 530. Transistors of the plurality of first inverters 511 to 514 may be degraded by the first voltage or the second voltage.

Operations of switches of the switch circuit 530 may be similar to operations of switches of FIGS. 3 to 7. The switch circuit 530 may be configured to select the plurality of first inverters 511 to 514 and the plurality of second inverters 521 to 524. The number of the plurality of first inverters 511 to 514, the number of the plurality of second inverters 521 to 524, and the number of inverters selected by the switch circuit 530 may be similar to or the same as each other. The switch circuit 530 may electrically connect the input terminal, inverters selected from among the plurality of first inverters 511 to 514 and the plurality of second inverters 521 to 524, and the output terminal in order.

In detail, the switch circuit 530 may select the plurality of second inverters 521 to 524 for outputting the reference signal (refer to FIGS. 4 and 8). In this case, a delay time of the test signal may be less than the case where all or a part of the plurality of first inverters 511 to 514 is selected. Here, the delay time of the test signal indicates a time difference between a time point when the test signal is applied to the input terminal to a time point when the test signal is output from the output terminal.

The switch circuit 530 may select the plurality of first inverters 511 to 514 for outputting the NBTI and PBTI monitoring signal (refer to FIGS. 7 and 8). In this case, a delay time of the test signal may be greater than a delay time of a test signal in the case where only the plurality of second inverters 521 to 524 are selected by the switch circuit 530.

The switch circuit 530 may select at least one of the plurality of first inverters 511 to 514 and at least one of the plurality of second inverters 521 to 524 for outputting the NBTI monitoring signal or the PBTI monitoring signal (refer to FIGS. 5, 6, and 8). In this case, the test signal may pass through at least one of the plurality of first inverters 511 to 514 and at least one of the plurality of second inverters 521 to 524 alternately. A delay time of the test signal may be greater than a delay time of the test signal in the case where only the plurality of second inverters 521 to 524 are selected by the switch circuit 530.

That is, the switch circuit 530 may select one of the inverters 511 and 521 connected in parallel between first and second nodes n1 and n2, one of the inverters 512 and 522 connected in parallel between the second node n2 and a third node n3, one of the inverters 513 and 523 connected in parallel between fourth and fifth nodes n4 and n5, and one of the inverters 514 and 524 connected in parallel between the fifth node n5 and a sixth node n6. The switch circuit 530 may select inverters not illustrated FIG. 10 in a manner similar to the above-described manner.

In some example embodiments, the test circuit 400 may further include a power circuit (not illustrated) similar to the power circuit 260 of FIG. 3. The power circuit may be configured to supply power to each of the plurality of second inverters 521 to 524 such that each of the plurality of second inverters 521 to 524 is not driven, when each of the plurality of first inverters 511 to 514 receives the first voltage or the second voltage.

Figure 11:
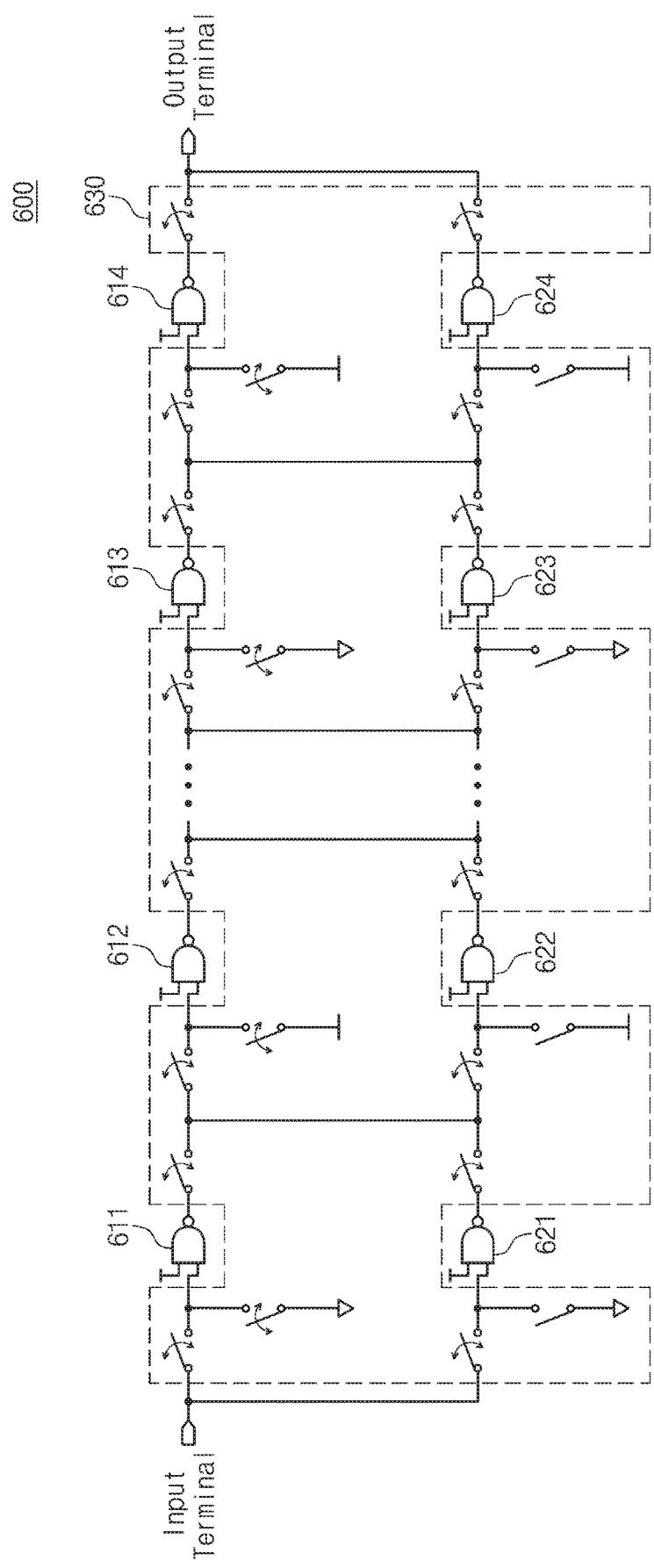
FIG. 11 is a block diagram illustrating a test circuit for testing the degradation of NAND gates according to some example embodiments.

FIG. 11 is a block diagram illustrating a test circuit for testing the degradation of NAND gates according to some example embodiments. Referring to FIG. 11, a test circuit 600 may include a plurality of first NAND gates 611 to 614, a plurality of second NAND gates 621 to 624, and a switch circuit 630. As described above, kinds of logic gates used in an integrated circuit may be various. FIG. 11 may relate to a degradation test of a NAND gate.

Each of the plurality of first NAND gates 611 to 614 may include two input terminals (e.g., a 2-input NAND gate) and may receive VDD through one of the two input terminals. Accordingly, the plurality of first NAND gates 611 to 614 may operate similarly to or the same as the plurality of first inverters 511 to 514 of FIG. 10. As in the above description, each of the plurality of second NAND gates 621 to 624 may include two input terminals (e.g., a 2-input NAND gate) and may receive VDD through one of the two input terminals. Accordingly, the plurality of second NAND gates 621 to 624 may operate similarly to or the same as the plurality of second inverters 521 to 524 of FIG. 10. The switch circuit 630 may operate similarly to or the same as the switch circuit 530 of FIG. 10. Here, the number of inputs of a NAND gate is not limited to the number of inputs illustrated.

Figure 12:
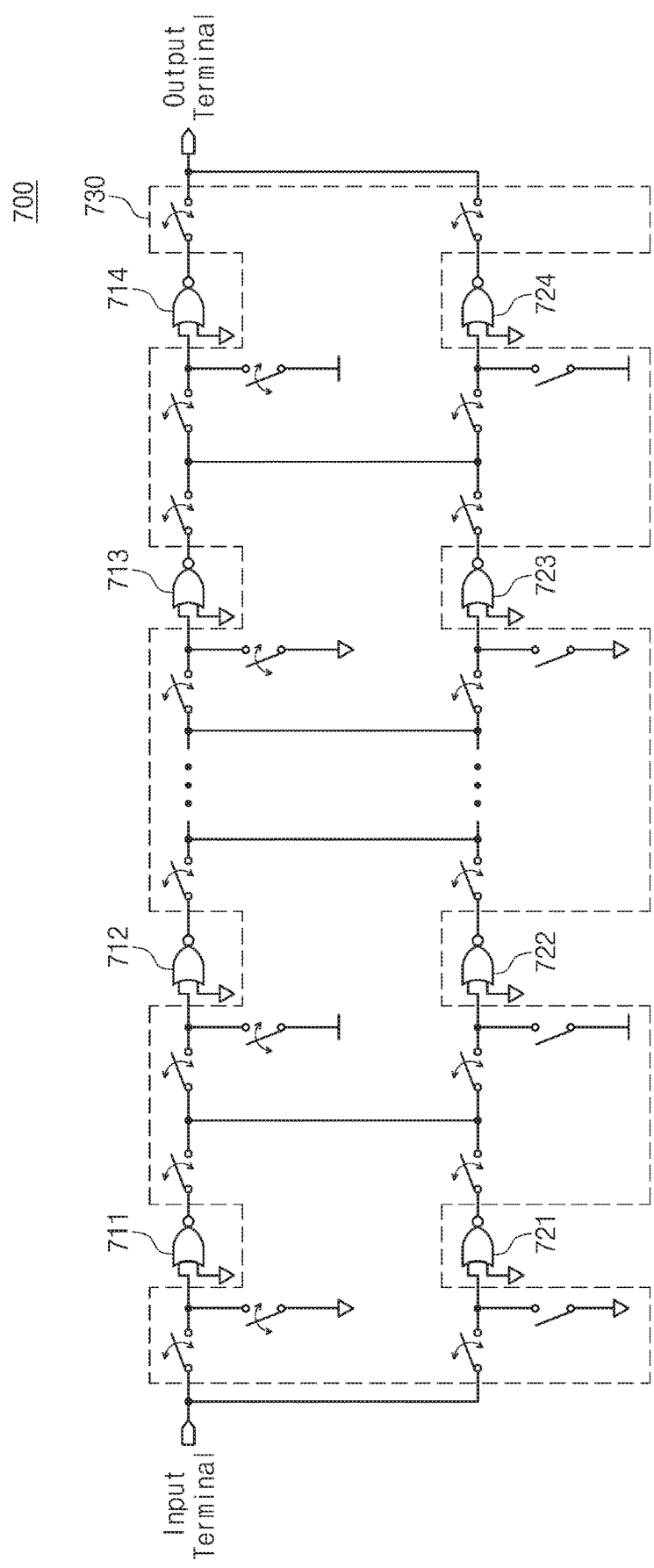
FIG. 12 is a block diagram illustrating a test circuit for testing the degradation of NOR gates according to some example embodiments.

FIG. 12 is a block diagram illustrating a test circuit for testing the degradation of NOR gates according to some example embodiments. Referring to FIG. 12, a test circuit 700 may include a plurality of first NOR gates 711 to 714, a plurality of second NOR gates 721 to 724, and a switch circuit 730. FIG. 12 may relate to a degradation test of a NOR gate.

Each of the plurality of first NOR gates 711 to 714 may include two input terminals (e.g., a 2-input NOR gate) and may receive VSS through one of the two input terminals. Accordingly, the plurality of first NOR gates 711 to 714 may operate similarly to or the same as the plurality of first inverters 511 to 514 of FIG. 10. As in the above description, each of the plurality of second NOR gates 721 to 724 may include two input terminals (e.g., a 2-input NOR gate) and may receive VSS through one of the two input terminals. Accordingly, the plurality of second NOR gates 721 to 724 may operate similarly to or the same as the plurality of second inverters 521 to 524 of FIG. 10. The switch circuit 730 may operate similarly to or the same as the switch circuit 530 of FIG. 10. Here, the number of inputs of a NOR gate is not limited to the number of inputs illustrated.

Figure 13:
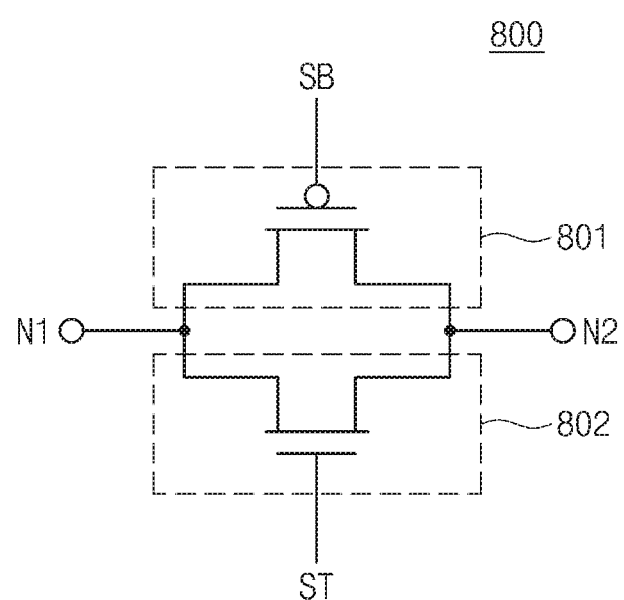
FIG. 13 is a block diagram illustrating a switch as illustrated in FIGS. 1 to 7 and 9 to 12.

FIG. 13 is a block diagram illustrating a switch as illustrated in FIGS. 1 to 7 and 9 to 12. A switch 800 may electrically connect first and second nodes N1 and N2 depending on a control signal pair ST and SB. In detail, the switch 800 may include a PMOS transistor 801 electrically connecting the first and second nodes N1 and N2 depending on a complementary control signal SB and an NMOS transistor 802 electrically connecting the first and second nodes N1 and N2 depending on a control signal ST. The PMOS transistor 801 and the NMOS transistor 802 may be connected in parallel.

Figure 14:
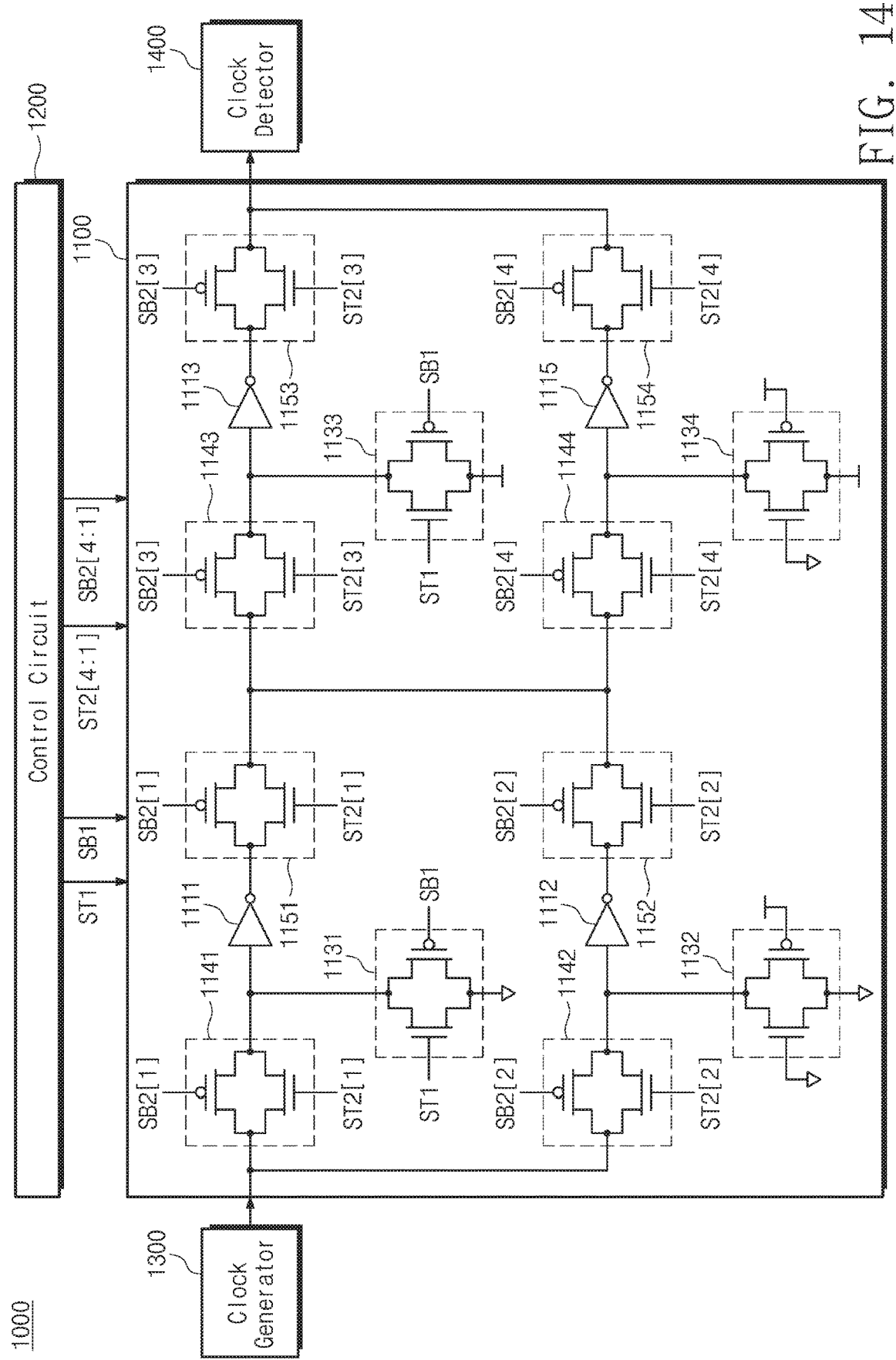
FIG. 14 is a block diagram illustrating a test system according to some example embodiments.

FIG. 14 is a block diagram illustrating a test system according to some example embodiments. Referring to FIG. 14, a test system 1000 may include a test circuit 1100, a control circuit 1200, a clock generator 1300, and a clock detector 1400.

The test circuit 1100 may include first to fourth inverters 1111 to 1114, first to fourth power switches 1131 to 1134, first to fourth input switches 1141 to 1144, and first to fourth output switches 1151 to 1154. The test circuit 1100 of FIG. 14 may refer to the case where the test circuit 100, 200, or 300 of FIGS. 1 to 7 is implemented by using the switch 800 of FIG. 13. The test circuit 1100 may operate to be similar to the test circuit 100, 200, or 300 described with reference to FIGS. 1 to 7.

The first power switch 1131 may provide the first voltage to the first inverter 1111 depending on a first control signal pair ST1 and SB1, and the third power switch 1133 may provide the second voltage to the third inverter 1113 depending on the first control signal pair ST1 and SB1. In some example embodiments, the second and fourth power switches 1132 and 1134 may be always turned off because the first voltage is applied to gates of NMOS transistors thereof and the second voltage is applied to gates of PMOS transistors thereof.

The first to fourth input switches 1141 to 1144 and the first to fourth output switches 1151 to 1154 may be turned off or turned on according to second control signal pairs ST2[4:1] and SB2[4:1]. The first to fourth input switches 1141 to 1144 and the first to fourth output switches 1151 to 1154 may operate to be similar to input switches and output switches of FIGS. 1 to 7.

The control circuit 1200 may generate the first control signal pair ST1 and SB1 and the second control signal pairs ST2[4:1] and SB2[4:1]. In detail, the control circuit 1200 may generate the first control signal pair ST1 and SB1 for degrading a PMOS transistor of the first inverter 1111 and an NMOS transistor of the third inverter 1113. The control circuit 1200 may generate the second control signal pairs ST2[4:1] and SB2[4:1] after degradation such that a clock of the clock generator 1300 is output through at least two of the first to fourth inverters 1111 to 1114.

The clock generator 1300 may generate a clock signal as a test signal (refer to a test signal of FIG. 8). For example, the clock generator 1300 may include an oscillator, a delay locked loop (DLL), a phase locked loop (PLL), or the like for generating the clock signal. Alternatively, the clock generator 1300 may buffer a clock signal applied from the outside of the test system 1000.

The clock detector 1400 may receive a clock signal output from the test circuit 1100. The clock detector 1400 may detect a frequency, a duty ratio, or the like of the output clock signal. For example, the clock detector 1400 may include a counter circuit that operates during a period of the output clock signal, which corresponds to logic "1" or logic "0". The clock detector 1400 may determine the clock signal output from the test circuit 1100 and may determine the degree of degradation of transistors.

FIG. 15 is a flowchart illustrating a test method of a test system of FIG. 14.

In operation S110, the control circuit 1200 may degrade the logic gates by providing the first and second voltages to logic gates. In FIG. 14, the control circuit 1200 may generate the first control signal pair ST1 and SB1, may provide the first voltage to the first inverter 1111, and may provide the second voltage to the third inverter 1113. Operation S110 may indicate, for example, a wafer burn in test process of an integrated circuit.

In operation S120, the clock detector 1400 may monitor a test signal that passes through a logic gate degraded by the first voltage. In FIG. 14, the control circuit 1200 may generate the second control signal pairs ST2[1] and SB2[1] and ST2[4] and SB2[4] and may connect the first and fourth inverters 1111 and 1114 between the clock generator 1300 and the clock detector 1400.

In operation S130, the clock detector 1400 may monitor a test signal that passes through a logic gate degraded by the second voltage. In FIG. 14, the control circuit 1200 may generate the second control signal pairs ST2[2] and SB2[2] and ST2[3] and SB2[3] and may connect the second and third inverters 1112 and 1113 between the clock generator 1300 and the clock detector 1400.

In operation S140, the clock detector 1400 may monitor a test signal that passes through logic gates degraded by the first and second voltages. In FIG. 14, the control circuit 1200 may generate the second control signal pairs ST2[1] and SB2[1] and ST2[3] and SB2[3] and may connect the first and third inverters 1111 and 1113 between the clock generator 1300 and the clock detector 1400.

In operation S150, the clock detector 1400 may monitor a test signal that passes through logic gates that are not degraded. In FIG. 14, the control circuit 1200 may generate the second control signal pairs ST2[2] and SB2[2] and ST2[4] and SB2[4] and may connect the second and fourth inverters 1112 and 1114 between the clock generator 1300 and the clock detector 1400. In some example embodiments, the order of operation S120 to S150 is not as illustrated in FIG. 15. For example, operation S120 to operation S150 may be performed in any order.

According to some example embodiments, even after transistors are degraded, a reference signal not delayed due to an NBTI and a PBTI, a signal delayed due to the NBTI, a signal delayed due to the PBTI, and a signal delayed due to the NBTI and the PBTI may be tested, respectively.

While some example embodiments have been described, it will be apparent to those of ordinary skill in the art that various changes and modifications may be made thereto without departing from the spirit and scope of the following claims.

What is claimed is:

1. A test circuit comprising:
   a first logic gate configured to receive a test signal or a first voltage;
   a second logic gate configured to receive the test signal;
   a third logic gate configured to receive an output of the first logic gate, an output of the second logic gate, or a second voltage;
   a fourth logic gate configured to receive the output of the first logic gate or the output of the second logic gate; and
   a power circuit configured to prevent the second and fourth logic gates from being driven by supplying power to the second and fourth logic gates when the first logic gate receives the first voltage and the third logic gate receives the second voltage.

2. The test circuit of claim 1, further comprising:
   a switch circuit configured to provide the first voltage to the first logic gate and the second voltage to the third logic gate, before the test signal is received by the first or second logic gate.

3. The test circuit of claim 2, wherein the provision of the first voltage to the first logic gate and the second voltage to the third logic gate causes propagation delays of the first and third logic gates to become greater than propagation delays of the second and fourth logic gates.

4. The test circuit of claim 2, wherein the switch circuit is further configured to:
   connect two of the first to fourth logic gates to cause the test signal to be output through the two of the first to fourth logic gates.

5. The test circuit of claim 4, wherein a delay time of the test signal when the switch circuit connects the first and fourth logic gates is greater than a delay time of the test signal when the switch circuit connects the second and fourth logic gates.

6. The test circuit of claim 4, wherein a delay time of the test signal when the switch circuit connects the second and third logic gates is greater than a delay time of the test signal when the switch circuit connects the second and fourth logic gates.

7. The test circuit of claim 4, wherein a delay time of the test signal when the switch circuit connects the first and third logic gates is greater than a delay time of the test signal when the switch circuit connects the second and fourth logic gates.

8. The test circuit of claim 1, wherein the first to fourth logic gates are the same as each other.

9. The test circuit of claim 8, wherein each of the first to fourth logic gates is an inverter.

10. A test circuit comprising:
   a first logic gate and a second logic gate connected in parallel between a first node and a second node;
   a third logic gate and a fourth logic gate connected in parallel between the second node and a third node; and a switch circuit configured to select one of the first and second logic gates and one of the third and fourth logic gates.

11. The test circuit of claim 10, wherein, before a test signal is input to the first node, each of the first and third logic gates receives a first voltage or a second voltage as an input.

12. The test circuit of claim 11, further comprising:
a power circuit configured to prevent the second and fourth logic gates from being driven by supplying power to the second and fourth logic gates when each of the first and third logic gates receives the first voltage or the second voltage.

13. The test circuit of claim 11, wherein
the first to fourth logic gates are the same as each other, and
the reception of the first voltage or the second voltage by the first and third logic gates causes propagation delays of the first and third logic gates to become greater than propagation delays of the second and fourth logic gates.

14. The test circuit of claim 11, wherein
the test signal is input to the first node and is output from the third node, and
a delay time of the test signal when the first and third logic gates are selected by the switch circuit is greater than a delay time of the test signal when the second and fourth logic gates are selected by the switch circuit.

15. The test circuit of claim 11, wherein
the test signal is input to the first node and is output from the third node, and
a delay time of the test signal when the first and fourth logic gates are selected by the switch circuit is greater than a delay time of the test signal when the second and fourth logic gates are selected by the switch circuit.

16. The test circuit of claim 11, wherein
the test signal is input to the first node and is output from the third node, and
a delay time of the test signal when the second and third logic gates are selected by the switch circuit is greater than a delay time of the test signal when the second and fourth logic gates are selected by the switch circuit.

17. The test circuit of claim 10, wherein the first to fourth logic gates are the same as each other.

18. A test circuit comprising:
a first logic gate configured to receive a test signal or a first voltage through a first input switch circuit and to output a first delay signal through a first output switch;
a second logic gate configured to receive the test signal through a second input switch circuit and to output a second delay signal through a second output switch;
a third logic gate configured to receive the first delay signal, the second delay signal, or a second voltage through a third input switch circuit and to output a third delay signal through a third output switch;
a fourth logic gate configured to receive the first delay signal or the second delay signal through a fourth input switch circuit and to output a fourth delay signal through a fourth output switch; and
a power circuit configured to prevent the second and fourth logic gates from being driven by supplying power to the second and fourth logic gates when the first logic gate receives the first voltage and the third logic gate receives the second voltage,
wherein the first to fourth input switch circuits are the same as each other, the first to fourth output switches are the same as each other, and the first to fourth logic gates are the same as each other.

19. The test circuit of claim 18, wherein the reception by the first logic gate of the first voltage and the reception by the third logic gate of the second voltage, causes propagation delays of the first and third logic gates to become greater than propagation delays of the second and fourth logic gates.

20. The test circuit of claim 19, further comprising:
a control circuit configured to control the first to fourth input switch circuits and the first to fourth output switches to cause the test signal to be output through two of the first to fourth logic gates and either the third output switch as the third delay signal or the fourth output switch as the fourth delay signal.

* * * * *